(12) United States Patent
Peroulas et al.

(10) Patent No.: US 8,482,349 B2
(45) Date of Patent: Jul. 9, 2013

(54) METHOD AND APPARATUS FOR LINEARIZING A NON-LINEAR POWER AMPLIFIER

(75) Inventors: James Peroulas, St. Louis, MO (US); Aimin You, Shenzhen (CN)

(73) Assignee: ZTE Wistron Telecom AB, Stockholm (SE)

( * ) Notice: Subject to any disclaimer, the term of this patent is extended or adjusted under 35 U.S.C. 154(b) by 0 days.

(21) Appl. No.: 13/255,717

(22) PCT Filed: Mar. 9, 2009

(86) PCT No.: PCT/CN2009/070701
§ 371 (c)(1),
(2), (4) Date: Oct. 13, 2011

(87) PCT Pub. No.: WO2010/102441
PCT Pub. Date: Sep. 16, 2010

(65) Prior Publication Data
US 2012/0092067 A1   Apr. 19, 2012

(51) Int. Cl.
*H03F 1/26* (2006.01)
(52) U.S. Cl.
USPC ........................................ 330/149
(58) Field of Classification Search
USPC ................................ 330/136, 149; 455/114.3
See application file for complete search history.

(56) References Cited

U.S. PATENT DOCUMENTS

| 4,389,618 A | 6/1983 | Bauman |
| 6,118,335 A * | 9/2000 | Nielsen et al. |
| 6,194,964 B1 | 2/2001 | Jun |
| 6,246,286 B1 | 6/2001 | Persson |
| 6,853,246 B2 | 2/2005 | Bauder et al. |
| 7,091,779 B2 * | 8/2006 | Sahlman ............ 330/149 |
| 7,145,962 B2 | 12/2006 | Lee |
| 2010/0033246 A1 * | 2/2010 | Draxler et al. ........ 330/149 |

FOREIGN PATENT DOCUMENTS

| CN | 1341992 A | 3/2002 |
| CN | 1384602 A | 12/2002 |
| CN | 1384996 A | 12/2002 |
| CN | 10157437 A | 10/2007 |
| JP | 2008-177899 | 7/2008 |
| KR | 20000013314 A | 3/2000 |

OTHER PUBLICATIONS

International Search Report for PCT/CN2009/070701, Completed by the Chinese Patent Office on Nov. 23, 2009, 3 Pages.

* cited by examiner

*Primary Examiner* — Steven J Mottola
(74) *Attorney, Agent, or Firm* — Brooks Kushman P.C.

(57) ABSTRACT

An apparatus and method for linearizing a non-linear power amplifier. The method comprises: performing an iteration algorithm by using a desired output signal of the non-linear power amplifier, to calculate an input signal of the non-linear power amplifier, whereby with the calculated input signal of the non-linear power amplifier, the non-linear power amplifier is linearized. The apparatus and method can produce a signal on the output of the non-linear power amplifier with an arbitrarily high quality of performance.

13 Claims, 3 Drawing Sheets

Method of finding an ideal predistortion signal

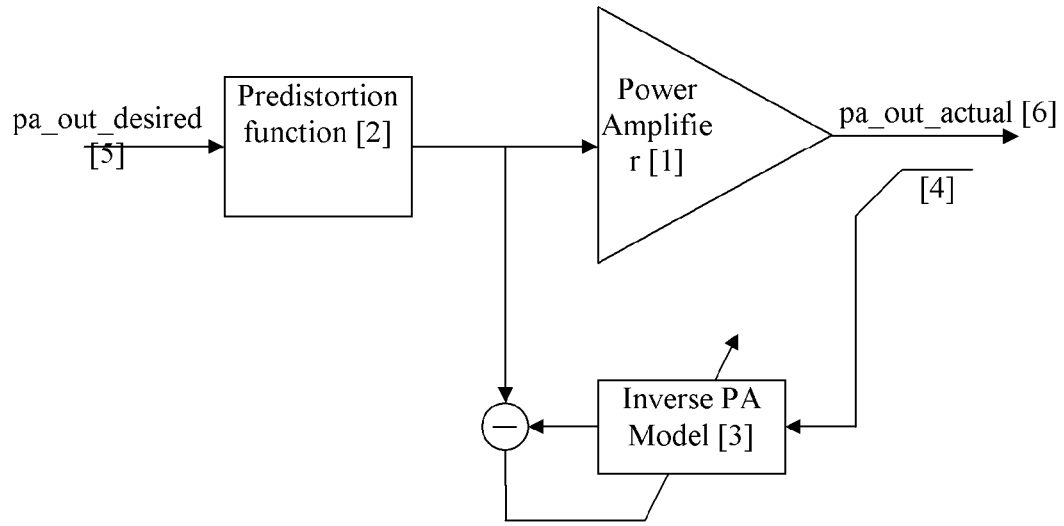
Figure 1 Indirect learning DPD (Prior Art)
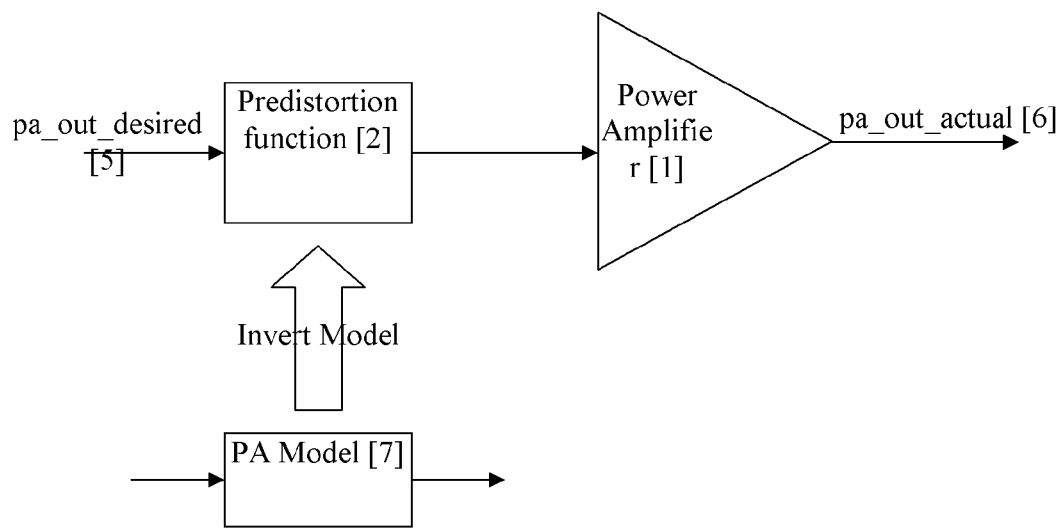
Figure 2 PA model inversion DPD (Prior Art)

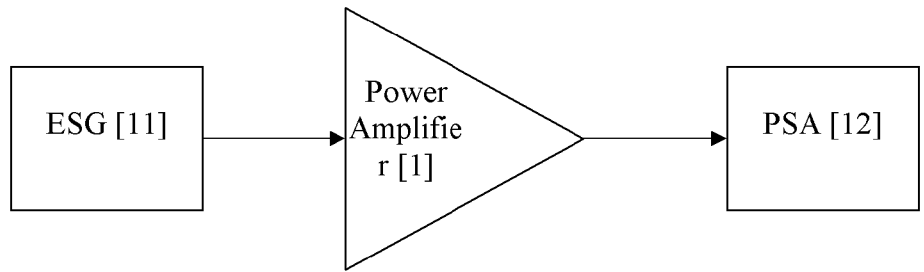
Figure 3 Method of finding an ideal predistortion signal
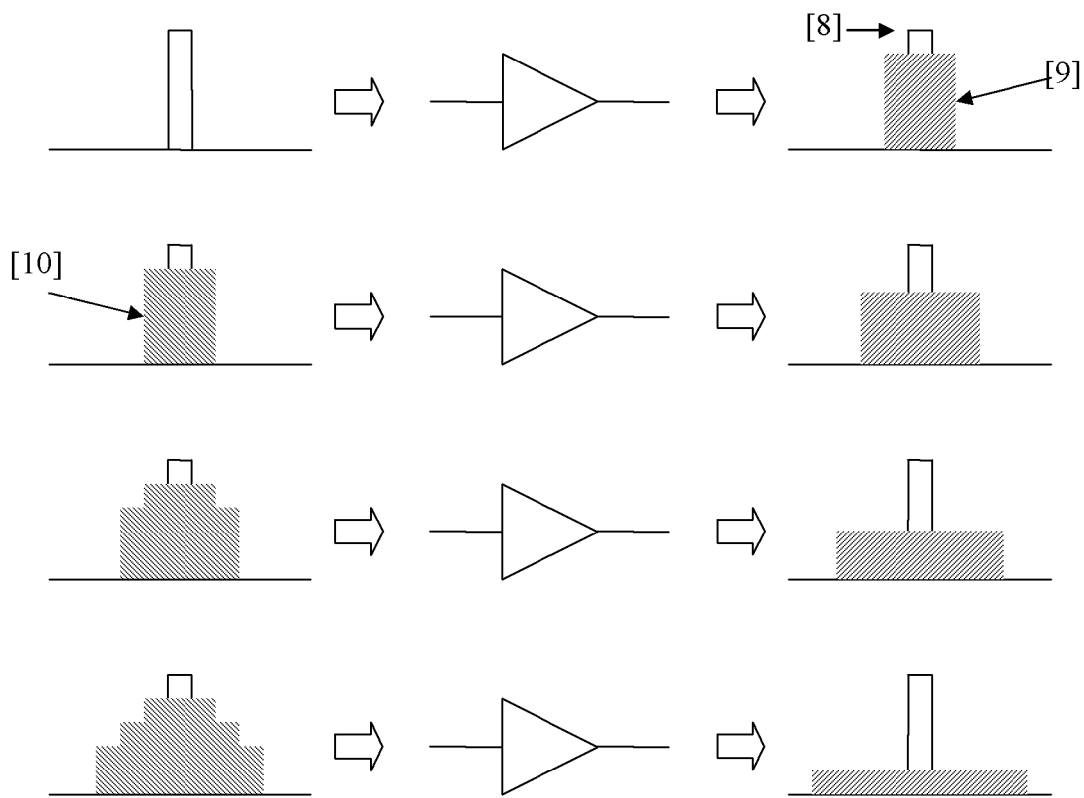
Figure 4 Iterative DPD

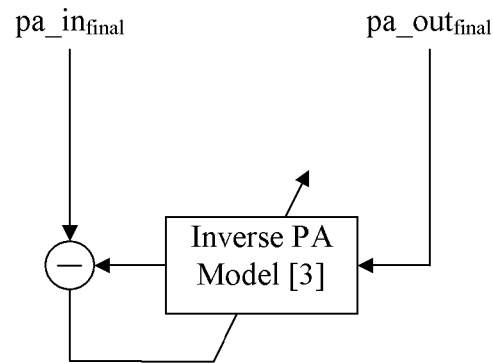
Figure 5 System identification based on perfect captured data
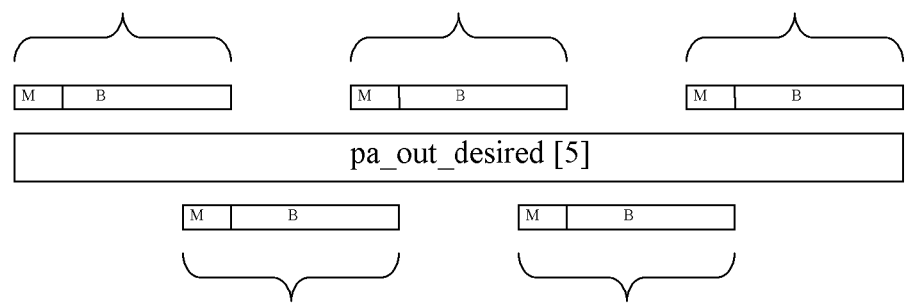
Figure 6 Segmentation of pa_out_desired

METHOD AND APPARATUS FOR LINEARIZING A NON-LINEAR POWER AMPLIFIER

CROSS-REFERENCE TO RELATED APPLICATION

This application is the U.S. national phase of PCT Application No. PCT/CN2009/070701 filed Mar. 9, 2009, the disclosure of which is incorporated in its entirety by reference herein.

TECHNICAL FIELD

The present invention relates to a communication system, especially to the linearization of a non-linear power amplifier in the communication system.

BACKGROUND

A power amplifier (PA) is a device used in many communication systems which takes as input a low power desired signal and produces as output a higher power version of the desired signal. Although PA's can be used as linear devices, they are often pushed to operate in their non-linear region because such operation can cause the PA to produce more output power and can also cause the PA to operate more efficiently. However, operating the PA in the nonlinear region comes at a cost in that the output of the PA now contains both a scaled up version of the desired signal, and also a significant amount of distortion.

Techniques exist whereby the signal coming into the PA is modified so that although the input to the PA differs radically from the desired signal, the output coming out of the PA is, however, a scaled up version of the desired signal. Some examples of techniques which can produce a PA input signal which will produce an arbitrary signal on the PA output are digital predistortion (DPD) or analog predistortion based on a certain assumed PA model.

These techniques, however, are limited in performance because they assume that the PA's characteristics can be modeled sufficiently by a specific model. These assumed models are only accurate up to a certain limit and hence the ultimate performance that can be obtained through the use of these techniques is also limited. It would be of benefit if it would be possible to create an arbitrary output on any PA with an arbitrary amount of output signal quality performance.

Digital predistortion (DPD), as shown in FIG. 1 (prior art), refers to a method in a communications system where the signal to be transmitted [5] is passed through a nonlinear predistortion function [2] before being sent to the nonlinear power amplifier PA [1]. The general idea is that the nonlinear predistortion function [2] is chosen such that the cascaded combination of the nonlinear predistortion function [2] and the nonlinear PA [1] will produce a system that is linear overall. Thus, the actual PA output [6], will simply be a scaled up version of the input to the predistortion function [2].

The predistortion function [2] is often inferred using the indirect learning architecture as depicted in FIG. 1 (prior art). A coupler [4], is used to extract a small amount of the power generated by the PA [1]. This signal is sent through an adaptable inverse PA model [3], which produces an output that is adapted to match, as closely as possible, the input to the PA [1]. This adaptation is often implemented as an LMS or an RLS algorithm, although it is possible to use other algorithms.

Once the difference between the output of the of the inverse PA model [3] and the PA input is substantially small enough (as measured by the power of the difference signal), the inverse PA model [3] is simply copied and used directly as the predistortion function [2]. No model inversion is necessary because the indirect learning architecture described in FIG. 1 (prior art) directly calculates the inverse model without first calculating the forward model.

Usually, this process needs to be repeated several times or over several iterations before the output of the PA [1] is considered to be satisfactory, as measured by common signal transmission quality measurements such as error vector magnitude (EVM) or adjacent channel leakage ration (ACLR).

A problem with the above structure is the difficulty in choosing the model to be used for the inverse PA model [3]. Common structures that are used are the Memory Polynomial (MP) or the Generalized Memory Polynomial (GMP), although other models can also be used. Before actually trying a certain model, it is not clear which model will yield the best performance, and it is also not clear which specific parameters for a particular model will yield the best performance. For example, with the Memory Polynomial model, one can specify both the maximum delay of the model and also the maximal nonlinear order of the model. It is not clear, in advance, whether the GMP will perform better than the MP and which settings for maximum delay and nonlinear order in the MP will produce the best results. Furthermore, because the PA [1] and the inverse PA model [3] are nonlinear entities, there are no known search algorithms available which will find the optimal models or model settings.

Typically, the inverse PA model is found by running the system in a lab environment with a real PA. A certain model and certain model settings are chosen and, after the system converges, one observes the final system performance using measurements such as EVM and ACLR. Then, the model and/or the settings are changed and the final system performance is measured again. This procedure may proceed for hundreds of measurements where each measurement may require several minutes of lab time. Finally, the model and settings which resulted in the best performance are chosen and used in the final system.

It would be beneficial if there was a method of improving the speed at which the optimal inverse PA model could be found.

An alternate form of DPD based on PA model inversion is shown in FIG. 2 (prior art). As in the indirect learning architecture, the signal to be transmitted [5] is passed through a nonlinear predistortion function [2] before being sent to the nonlinear power amplifier PA [1]. The general idea is that the nonlinear predistortion function [2] is chosen such that the cascaded combination of the nonlinear predistortion function [2] and the nonlinear PA [1] will produce a system that is linear overall. Thus, the actual PA output [6], will simply be a scaled up version of the input to the predistortion function [2].

With model inversion DPD, the forward PA model [7] is known and is an accurate predictor of the PA's output, given a certain input. This forward PA model may arise from measurements of an actual PA, or it may arise from a mathematical model derived by analyzing the circuit diagram of the PA. The key is that this model must be inverted and then used as the predistortion function.

One of the major problems with this architecture is that although the PA forward model may in fact be very simple, the inversion of even a very simple nonlinear model is often very difficult and requires a model that is several orders more complex than the PA model itself.

It would be beneficial if a method existed to linearize the PA without needing to invert the PA model.

DISCLOSURE OF INVENTION

An object of the present invention is to provide a method for linearizing a non-linear power amplifier, which can produce a signal on the output of the non-linear power amplifier with an arbitrarily high quality of performance. The method comprises: performing an iteration algorithm by using a desired output signal of the non-linear power amplifier, to calculate an input signal of the non-linear power amplifier, whereby with the calculated input signal of the non-linear power amplifier, the non-linear power amplifier is linearized.

In accordance with a certain embodiment of the invention, the iteration algorithm is given by:

$$\text{pa\_in}_{n+1} = \text{pa\_in}_n - \text{alpha} \times \left( \frac{\text{pa\_out}_n - \text{pa\_out\_desired}}{G_n} \right),$$

wherein pa_out_desired is the desired output signal of the non-linear power amplifier, $\text{pa\_in}_n$ is the calculated input signal of the non-linear power amplifier for iteration n, $\text{pa\_out}_n$ is a time aligned output signal of the non-linear power amplifier for iteration n, $G_n$ is a gain of the non-linear power amplifier for iteration n which can be calculated by $\text{pa\_in}_n$ and $\text{pa\_out}_n$, and alpha is in a range from 0 to 1, and wherein $\text{pa\_in}_1$ is the desired output signal of the non-linear power amplifier divided by an estimated gain of the non-linear power amplifier.

In accordance with a further embodiment of the invention, the estimated gain of the non-linear power amplifier is specified by a manufacturer of the non-linear power amplifier.

In accordance with a further embodiment of the invention, the estimated gain of the non-linear power amplifier is obtained by measuring the non-linear power amplifier when a low power signal is input into the non-linear power amplifier.

In accordance with a further embodiment of the invention, the method further comprises: performing a simulation algorithm by using the calculated input signal of the non-linear power amplifier and a corresponding time aligned output signal of the non-linear power amplifier, to simulate an inverse model of the non-linear power amplifier, whereby the power amplifier is linearized by using the simulated inverse model of the non-linear power amplifier.

In accordance with a further embodiment of the invention, the iteration algorithm is given by:

$$\text{pa\_mdl\_in\_corr}_{n,i} = \text{pa\_mdl\_in}_{n,i} - \text{alpha} \times \left( \frac{\text{pa\_out}_{n,i} - \text{pa\_out\_desired}}{G_{n,i}} \right),$$

wherein $S_n$ represents segment n and is composed of samples n*B−M to (n+1)*B−1 of the desired output signal of the non-linear power amplifier, $\text{pa\_mdl\_in}_{n,i}$ is an input signal of a forward model of the non-linear power amplifier for segment n and iteration i, $\text{pa\_mdl\_out}_{n,i}$ is an output signal of the forward model of the non-linear power amplifier for segment n and iteration i, $G_{n,i}$ is an gain of the forward model of the non-linear power amplifier for segment n and iteration i which can be calculated by $\text{pa\_mdl\_in}_{n,i}$ and $\text{pa\_mdl\_out}_{n,i}$, alpha is in a range from 0 to 1, and $\text{pa\_mdl\_in\_corr}_{n,i}$ is an input correction signal for segment n and iteration i, wherein $\text{pa\_mdl\_in}_{n,1}$ is $S_n$ divided by an estimated gain of the forward model, $\text{pa\_mdl\_in}_{n,i+1}$ is obtained by concatenating samples B to B+M−1 of $\text{pa\_mdl\_in}_{n-1,end}$ and samples M to B+M−1 of $\text{pa\_mdl\_in\_corr}_{n,i}$, $\text{pa\_mdl\_in}_{n-1,end}$ is an input signal of a forward model of the non-linear power amplifier for segment n−1 of a final iteration, and $\text{pa\_mdl\_in}_{0,end}$ is 0, whereby the input signal of the non-linear power amplifier is obtained by concatenating samples M to B+M−1 of the input signals of the forward model of the non-linear power amplifier of the last iteration for all segments, wherein the forward model of the non-linear power amplifier is a zero delay and memory limited forward model, and an output of the forward model is related to a current input sample and previous M−1 samples of the forward model.

Another object of the present invention is to provide an apparatus for linearizing a non-linear power amplifier, which can produce a signal on the output of the non-linear power amplifier with an arbitrarily high quality of performance. The apparatus comprises: a device for performing an iteration algorithm by using a desired output signal of the non-linear power amplifier, to calculate an input signal of the non-linear power amplifier, whereby with the calculated input signal of the non-linear power amplifier, the non-linear power amplifier is linearized.

In accordance with a certain embodiment of the invention, the iteration algorithm is given by:

$$\text{pa\_in}_{n+1} = \text{pa\_in}_n - \text{alpha} \times \left( \frac{\text{pa\_out}_n - \text{pa\_out\_desired}}{G_n} \right),$$

wherein pa_out_desired is the desired output signal of the non-linear power amplifier, $\text{pa\_in}_n$ is the calculated input signal of the non-linear power amplifier for iteration n, $\text{pa\_out}_n$ is a time aligned output signal of the non-linear power amplifier for iteration n, $G_n$ is a gain of the non-linear power amplifier for iteration n which can be calculated by $\text{pa\_in}_n$ and $\text{pa\_out}_n$, and alpha is in a range from 0 to 1; wherein $\text{pa\_in}_1$ is the desired output signal of the non-linear power amplifier divided by an estimated gain of the non-linear power amplifier.

In accordance with a further embodiment of the invention, the estimated gain of the non-linear power amplifier is specified by a manufacturer of the non-linear power amplifier.

In accordance with a further embodiment of the invention, the estimated gain of the non-linear power amplifier is obtained by measuring the non-linear power amplifier when a low power signal is input into the non-linear power amplifier.

In accordance with a further embodiment of the invention, the apparatus further comprises: an electronic signal generator for repeatedly generating a signal which is the calculated input signal of the non-linear power amplifier; a signal capturing device for capturing an output signal of the non-linear power amplifier, such that at least one period of the signal being generated by the electronic signal generator is captured; and a filter for filtering out frequencies that can not be generated by the electronic signal generator and can not be captured by the signal capturing device from a signal of subtracting pa_out_desired from $\text{pa\_out}_n$.

In accordance with a further embodiment of the invention, bandwidths of the electronic signal generator and the signal capturing device are related to the non-linear power amplifier.

In accordance with a further embodiment of the invention, the signal capturing device is configured to capture the output signal of the non-linear power amplifier for iteration n more than one times, whereby an averaged result of more than one captures is taken as $\text{pa\_out}_n$.

In accordance with a further embodiment of the invention, the apparatus further comprises: an inverse model of the signal capturing device for post-processing the output signal of the non-linear power amplifier captured by the signal capturing device, whereby a linearity of the signal capturing device can be improved.

In accordance with a further embodiment of the invention, the apparatus further comprises: a simulator for performing a simulation algorithm by using the calculated input signal of the non-linear power amplifier and a corresponding time aligned output signal of the non-linear power amplifier, to simulate an inverse model of the non-linear power amplifier, whereby the power amplifier is linearized by using the simulated inverse model of the non-linear power amplifier.

In accordance with a further embodiment of the invention, the iteration algorithm is given by:

$$\text{pa\_mdl\_in\_corr}_{n,i} = \text{pa\_mdl\_in}_{n,i} - \text{alpha} \times \left( \frac{\text{pa\_out}_{n,i} - \text{pa\_out\_desired}}{G_{n,i}} \right),$$

wherein $S_n$ represents segment n and is composed of samples n*B-M to (n+1)*B-1 of the desired output signal of the non-linear power amplifier, $\text{pa\_mdl\_in}_{n,i}$ is an input signal of a forward model of the non-linear power amplifier for segment n and iteration i, $\text{pa\_mdl\_out}_{n,i}$ is an output signal of the forward model of the non-linear power amplifier for segment n and iteration i, $G_{n,i}$ is an gain of the forward model of the non-linear power amplifier for segment n and iteration i which can be calculated by $\text{pa\_mdl\_in}_{n,i}$ and $\text{pa\_mdl\_out}_{n,i}$, alpha is in a range from 0 to 1, and $\text{pa\_mdl\_in\_corr}_{n,i}$ is an input correction signal for segment n and iteration i, wherein $\text{pa\_mdl\_in}_{n,1}$ is $S_n$ divided by an estimated gain of the forward model, $\text{pa\_mdl\_in}_{n,i+1}$ is obtained by concatenating samples B to B+M-1 of $\text{pa\_mdl\_in}_{n-1,end}$ and samples M to B+M-1 of $\text{pa\_mdl\_in\_corr}_{n,i}$, $\text{pa\_mdl\_in}_{n-1,end}$ is an input signal of a forward model of the non-linear power amplifier for segment n-1 of a final iteration, and $\text{pa\_mdl\_in}_{0,end}$ is 0, whereby the input signal of the non-linear power amplifier is obtained by concatenating samples M to B+M-1 of the input signals of the forward model of the non-linear power amplifier of the last iteration for all segments, wherein the forward model of the non-linear power amplifier is a zero delay and memory limited forward model, and an output of the forward model is related to a current input sample and previous M-1 samples of the forward model.

BRIEF DESCRIPTION OF THE DRAWINGS

FIG. 1 shows an indirect learning DPD;
FIG. 2 shows a PA model inversion DPD;
FIG. 3 shows a method of finding an ideal predistortion signal;
FIG. 4 shows an iterative DPD;
FIG. 5 shows system identification based on perfect captured data; and
FIG. 6 shows segmentation of pa_out_desired.

DETAILED DESCRIPTION OF THE INVENTION

One embodiment of the invention is implemented by placing the power amplifier (PA) [1] in a measurement setup as shown in FIG. 3. The signal going to the power amplifier [1] comes from a device which can generate an arbitrary test signal which repeats cyclically, such as an electronic signal generator (ESG) [11]. Because the PA is nonlinear, a large input bandwidth is required to produce a certain clean output bandwidth. The bandwidth of the ESG [11] typically must be 5-10 times the bandwidth of the desired operational bandwidth of the PA [1]. For example, if 5 MHz of clean signal are desired on the output, we may need to supply 25-50 MHz of bandwidth on the input. But it should be noted that different PA's will require a different amount of bandwidth from the ESG. The output of the PA [1] is captured in a device capable of capturing at least one full period of the signal being generated by the ESG [11], such as a programmable spectrum analyzer (PSA) [12]. The bandwidth of the PSA [12] must also be 5-10 times the bandwidth of the desired operational bandwidth of the PA [1]. The bandwidth of the PSA also depends on the particular PA.

In an actual lab environment, the ESG and the PSA may have different sampling rates. However any of a number of well known techniques can be used to effectively change the sampling rate of the data captured by the PSA to be equal to the sampling rate of the data sent into the ESG. Therefore, the following text assumes that the captured signal, coming from the PSA, has been resampled to the sampling rate of the ESG.

The general concept is that the invention will iterate several times, and with each iteration, the output of the PA [1] will look more and more like the desired PA output. In the first iteration, the signal going into the PA [1], $\text{pa\_in}_1$ (with length N samples), from the ESG is simply the desired PA output signal scaled down by a rough estimate of what the gain of the PA [1] will be ($G_e$). It is not necessary for $G_e$ to be known very accurately and a rough estimate will do for the first iteration. For example the gain of the PA may be specified by the manufacturer and this value may be used as $G_e$. Another possibility is that a low power signal may be sent into the PA from the ESG and the power of the signal coming out of the PA may be measured by the PSA. In this case, a rough estimate for $G_e$ can be obtained as the square root of the ratio of the power of the signal from the ESG and the power of the signal in the PSA.

$$\text{pa\_in}_1 = \frac{\text{pa\_out\_desired}}{G_e} \qquad \text{Eq 1}$$

The repeating signal $\text{pa\_in}_1$ is programmed into the ESG [11], and the PSA [12] then captures one complete period of the output of the PA [1]. Because of delays inherent in the system, the captured signal will not be perfectly time aligned with $\text{pa\_in}_1$. Using cross-correlations, the captured signal can be shifted in time so that the delay between $\text{pa\_in}_1$ and the time shifted captured signal will be 0. After this time alignment, the time shifted captured signal for iteration n will be called $\text{pa\_out}_n$. This time alignment is performed for each iteration.

Because a PA is only mildly nonlinear, the gain of the PA for this, or any subsequent iteration, can be estimated as:

$$G_n = \frac{\sum_{i=0}^{N-1} \text{pa\_in}_n(i) \times \text{pa\_out}_n(i)}{\sum_{i=0}^{N-1} \text{pa\_in}_n(i) \times \text{pa\_in}_n(i)} \qquad \text{Eq 2}$$

Throughout this invention, complete sequences of signals will be represented without an index. Specific samples of a signal will be represented with an index. For example, $\text{pa\_in}_n$ represents the entire array storing all the samples used by the ESG for iteration n. pa_in$_n$(i) represents the i'th element of the array of samples pa_in$_n$. Because pa_in$_n$ is of length N (as stated earlier), the range of value that i can take is 0 through N−1.

Again, because the PA is only mildly nonlinear, the output of the PA can be considered to be composed of two components. One component is the desired PA output, and the other component is a difference signal:

$$\text{pa\_out}_n = \text{pa\_out\_desired} + \text{diff}_n \qquad \text{Eq 3}$$

$$\text{diff}_n = f_B(\text{diff}_n) = f_B(\text{pa\_out}_n - \text{pa\_out\_desired}) \qquad \text{Eq 4}$$

Where $f_B(x)$ is the result of passing signal x through a zero-delay filter whose effect is to remove any frequencies that cannot be generated by the ESG and any frequencies that cannot be captured by the PSA. For example, this filter can be implemented by first taking an FFT of x, zeroing the frequencies that cannot be generated by the ESG, zeroing the frequencies that cannot be captured by the PSA, and finally performing an IFFT operation.

The idea is that during the next iteration, the input to the PA will be adjusted so as to cancel out the diff$_n$ signal that was measured during the current iteration. Although the diff$_n$ signal may be cancelled out, new distortion products will be introduced which will be cancelled out in future iterations of the algorithm. However, the new distortion products will be at a lower power level and hence, as the algorithm iterates the difference between the actual PA output and the desired PA output will consistently decrease.

Specifically, the input for iteration n+1 is calculated as:

$$\text{pa\_in}_{n+1} = \text{pa\_in}_n - \text{alpha} \times \frac{\text{diff}_n}{G_n} \qquad \text{Eq 5}$$

Wherein, alpha takes on a value between 0.0 and 1.0. The closer alpha is to 1.0, the more quickly the algorithm will converge on a solution, but the more unstable the algorithm may be. Typically, values of alpha between 0.5 and 0.8 offer a good balance between convergence speed and stability. These values are determined experimentally and would vary between different PA's.

The above procedure is demonstrated graphically in FIG. 4. The PA output after the first iteration is composed of the desired PA output [8], and a difference signal [9] indicated with a right-diagonally shaded box. The input used for the second iteration is composed of the original input to the PA and a signal designed to compensate for the difference signal measured in the first iteration. This compensation component is indicated in the figure with a left-diagonally shaded box [10]. As can be seen in the figure, on the output of the second iteration, the original difference signal [9] is gone, but a new, smaller difference signal has appeared. This new difference signal is removed with the next iteration which in turn introduces a new, even smaller, difference signal.

Although FIG. 4 only shows 4 iterations of this algorithm, this iterative procedure can continue and the key issue is that the performance of this algorithm is only limited by the noise performance and nonlinearity of the PSA. For example, if the PSA introduces noise into the captured data, there is no way that a signal can be placed inside the ESG to compensate for the noise. Thus, we are limited in performance by the noise and nonlinearities of the PSA. This means that no matter which PA is inserted into the test setup, as long as the PA is only mildly nonlinear (almost all PA's are only mildly nonlinear), this procedure will always be able to find a solution so that the PA output will be as similar as pa_out_desired up to the measurement limit of the PSA.

It should be noted that because the signals being used are repeating cyclical signals, the noise performance of the PSA can be increased by forcing the PSA to perform several captures and then averaging the results of the captures. For example, if two captures are performed and averaged, this is equivalent to improving the noise performance of the PSA by 3 dB. Four captures would lead to a 6 dB improvement, and so on. This technique of performing multiple captures in the PSA can only be used to improve the noise performance of the PSA. If the PSA also contains nonlinearities, these nonlinearities cannot be reduced by performing multiple captures.

Techniques do exist, however, which can be used to improve the linearity of the PSA. For example, separately, a known signal can be sent into the PSA and the output can be observed. A mathematical model can be built which can model these nonlinearities and this model can be inverted. This inverse model can then be used to post-process the captured data so as to remove, or at least reduce, the nonlinearities in the PSA. Such techniques can be used to improve the linearity of the PSA and hence improve the overall performance of the invention.

Iterations can be performed over and over until some performance requirement has been met. For example, iterations can be performed until there is very little or no difference in the PA output between one iteration and the next. Alternatively, iterations can be performed until the difference between the actual PA output and pa_out_desired becomes smaller than a certain threshold. Alternatively, a fixed number of iterations can be performed.

The final predistorted signal going into the PA is called pa_in$_{final}$ and the final signal coming out of the PA is pa_out$_{final}$. Please note that pa_out$_{final}$ is basically the same as a scaled version pa_out_desired with the only differences being those caused by the measurement error of the PSA.

The major benefit of this method is that the PA can be made to produce an arbitrary signal, with an arbitrary amount of signal fidelity, limited only by the measurement accuracy of the PSA. This is a major improvement over the prior art where the fidelity of the signal could only improve until a certain limit as determined by the accuracy of the underlying PA model. Please note that PSA is only an example, and any device capable of capturing at least one full period of the signal being generated by the ESG can be used to obtain this major benefit. Then, the signal fidelity is only limited by the measurement accuracy of this device.

In another embodiment of the invention, once the pa_in$_{final}$ and pa_out$_{final}$ signals are determined using the previous embodiment of the invention; they can be loaded up into a computer that can perform system identification. Because the signals are stored in memory or in the computer's hard drive, the computer can perform many rapid simulations to determine which inverse PA model can best be used for predistortion, and also which parameters should be applied to the inverse PA model so as to give the best performance. For performing these rapid simulations, any system identification technique can be used.

This procedure can be contrasted with the one described in FIG. 1 (prior art), where each inverse PA model and each set of parameters for a particular inverse PA model needed to be measured in a slow lab environment. The procedure described above is several orders of magnitude faster than the prior art and, given the same amount of search time, allows for many more models to be searched so as to find the best solution.

Another embodiment of the invention arises when an accurate zero delay, memory limited model of the forward path of the PA is available. Such a model is one for which the impulse response peaks at a time offset of 0, and for which the output is a function of only the current input sample and the previous M−1 samples, for finite M. Note that for some nonlinear models, it may be difficult or impossible to calculate a meaningful impulse response. For such models, it suffices that for typical signals to be transmitted through the PA, the cross-correlation between the PA model's input and the PA model's output peaks at a time offset of 0. This model may come from measurements of a PA, or perhaps it can be derived from a mathematical analysis of the PA's circuit diagram. It is noted that the performance of this embodiment is limited by the accuracy of the PA model.

The first step is that the desired PA output signal, pa_out_desired(n), must be broken up into smaller segments. The length of each segment is B+M. B is the number of PA output samples that will be produced from each segment and depends on the implementation. The larger B is, the more efficient the algorithm, but also the larger the delay in creating the PA's input signal. This is a design parameter that will be determined by the particular implementation that has been chosen to realize this invention.

Segment n ($S_n$) of length B+M is composed of samples n*B−M through (n+1)*B−1 of pa_out_desired as indicated by the following notation:

$$S_n = \text{pa\_out\_desired}(n*B-M:(n+1)*B-1) \qquad \text{Eq 6}$$

FIG. 6 is a graphical depiction of how pa_out_desired can be split up into several segments. The brackets indicate the segments of length B+M samples. Please note that the signal can be segmented in any manner as long as each segment is of length B+M and the overlap between segments is M. This is just one manner in which pa_out_desired can be segmented.

Each segment is processed individually using the following iterative procedure.

First, the signal going into the PA model (pa_mdl_in) for segment n, iteration 1 is created as follows:

$$\text{pa\_mdl\_in}_{n,1} = \frac{S_n}{G_e} \qquad \text{Eq 7}$$

$G_e$ is a rough estimate of the gain of the PA model and is only used for the first iteration. It is not necessary for this number to be very accurate and a rough estimate is good enough. One method that can be used to estimate $G_e$ is that first, a random noise signal with an average power level similar to the typical power level expected to be input to the PA model can be generated. The PA model can be simulated and the average power of the signal on the output of the PA model can be measured. $G_e$ can simply be set to be the square root of the ratio of the power of the output signal divided by the power of the input signal.

pa_mdl_in$_{n,1}$ is sent through the PA model to produce pa_mdl_out$_{n,1}$ which also is of length B+M. The gain for this iteration or any other iteration i can be calculated as:

$$G_{n,i} = \frac{\sum_{k=0}^{B+M-1} \text{pa\_mdl\_in}_{n,i}(k) \times \text{pa\_mdl\_out}_{n,i}(k)}{\sum_{k=0}^{B+M-1} \text{pa\_mdl\_in}_{n,i}(k) \times \text{pa\_mdl\_in}_{n,i}(k)} \qquad \text{Eq 8}$$

Then, a difference signal for segment n, iteration i is calculated as:

$$\text{diff}_{n,i} = \text{pa\_mdl\_out}_{n,i} - S_n \qquad \text{Eq 9}$$

A correction signal is calculated as:

$$\text{pa\_mdl\_in\_corr}_{n,i} = \text{pa\_mdl\_in}_{n,i} - \text{alpha} \times \frac{\text{diff}_{n,i}}{G_{n,i}} \qquad \text{Eq 10}$$

Where alpha is a constant that takes a value between 0 and 1. The closer alpha is to 1, the faster the convergence, but the higher the risk of instability. Typically, alpha will have a value between 0.5 and 0.8.

Finally, to complete this iteration, the PA model input signal for the next iteration is created:

$$\text{pa\_mdl\_in}_{n,i+1} = \{\text{pa\_mdl\_in}_{n-1,end}(B:B+M-1), \text{pa\_mdl\_in\_corr}_{n,i}(M:B+M-1)\} \qquad \text{Eq 11}$$

Where the notation {A,B} indicates that the two sequences A and B should be concatenated together. Furthermore, pa_mdl_in$_{n,end}$ indicates the value of pa_mdl_in after the final iteration of processing for segment n.

It should be noted that pa_mdl_in$_{n,i+1}$ depends on pa_mdl_in$_{n-1,end}$. If pa_mdl_in$_{n-1,end}$ is not available, this signal can be replaced by zeros in the above equation pa_mdl_in$_{n-1,end}$ is not available, for instance, when the first S segment is being processed.

This iterative process can continue and with each iteration i, pa_mdl_out$_{n,i}$ will start to look more and more like $S_n$. The iteration process can continue for a fixed number of iterations, or an automatic iteration termination mechanism can be used. For example, one possibility is to keep iterating until the error power of the difference between pa_mdl_out$_{n,i}$ and $S_n$ becomes lower than a certain threshold.

The signal applied to the PA is created as:

$$\begin{aligned} \text{pa\_in} = \{ & \\ & \text{pa\_mdl\_in}_{0,end}(M:B+M-1), \\ & \text{pa\_mdl\_in}_{1,end}(M:B+M-1), \\ & \text{pa\_mdl\_in}_{2,end}(M:B+M-1), \\ & \ldots \\ \} & \end{aligned} \qquad \text{Eq 12}$$

In an typical realization using, for example, an FPGA, simultaneously while pa_mdl_in$_{n,end}$(M:B+M-1) is being sent to the PA, pa_mdl_in$_{n+1,end}$ will be calculated using the iterative process described above.

The primary advantage of this embodiment of the invention is that whereas the prior art shown in FIG. 2 attempted to mathematically invert a model, this embodiment of the invention does not need to perform model inversion at all. It can generate the correct PA input given only a forward model of the PA. Because this embodiment of the invention does not attempt to invert a nonlinear model, no model inversion errors are introduced.

While several embodiments of the invention have been illustrated and described, it is not intended that these embodiments illustrate and describe all possible forms of the invention. Rather, the words used in the specification are words of description rather than limitation, and it is understood that various changes and modifications may be made without departing from the spirit and scope of the invention.

What is claimed is:

1. A method for linearizing a non-linear power amplifier, comprising:
performing an iteration algorithm by using a desired output signal of the non-linear power amplifier, to calculate an input signal of the non-linear power amplifier, wherein during iteration n+1, the input signal is adjusted to cancel out the difference between actual output signal and the desired output signal that measured during iteration n, n is an positive integer;
whereby with the calculated input signal of the non-linear power amplifier, the non-linear power amplifier is linearized;
wherein the iteration algorithm is given by:

$$pa\_in_{n+1} = pa\_in_n - alpha \times \left( \frac{pa\_out_n - pa\_out\_desired}{G_n} \right),$$

wherein pa_out_desired is the desired output signal of the non-linear power amplifier pa_in$_a$ is the calculated input signal of the non-linear power amplifier for iteration n, pa_out$_n$ is a time aligned output signal of the non-linear power amplifier for iteration n, G$_n$ is a ain of the non-linear power amplifier for iteration n which can be calculated by pa_in$_n$ and pa_out$_n$, is in a range from 0 to 1, and wherein pa_in$_1$ is the desired output signal of the non-linear power amplifier divided by an estimated gain of the non-linear power amplifier;
or
the iteration algorithm is given by:

$$pa\_mdl\_in\_corr_{n,i} = pa\_mdl\_in_{n,i} - alpha \times \left( \frac{pa\_mdl\_out_{n,i} - S_n}{G_{n,i}} \right),$$

wherein S$_n$ represents segment n and is composed of samples n*B−M to n+1*B−1 of the desired output signal of the non-linear power amplifier, pa_mdl_in$_{n,i}$ is an input signal of a forward model of the non-linear power amplifier for segment n and iteration i, pa_mdl_out$_{n,i}$ is an output signal of the forward model of the non-linear power amplifier for segment n and iteration i, G$_{n,i}$ is an gain of the forward model of the non-linear power amplifier for segment n and iteration i which can be calculated by pa_mdl_in$_{n,i}$ and pa_mdl_out$_{n,i}$, alpha is in a range from 0 to 1, and pa_mdl_in_corr$_{n,i}$ is an input correction signal for segment n and iteration i,
wherein pa_mdl_in$_{n,1}$ is S$_n$ divided by an estimated gain of the forward model, pa_mdl_in$_{n,i+1}$ is obtained by concatenating samples B to B+M−1 of pa_mdl_in$_{n−1,end}$ and samples M to B+M−1 of pa_mdl_in_corr$_{n,i}$, pa_mdl_in$_{n−1,end}$ is an input signal of a forward model of the non-linear power amplifier for segment n−1 of a final iteration, and pa_mdl_in$_{0,end}$ is 0,
whereby the input signal of the non-linear power amplifier is obtained by concatenating samples M to B+M−1 of the input signals of the forward model of the non-linear power amplifier of the last iteration for all segments,
wherein the forward model of the non-linear power amplifier is a zero delay and memory limited forward model, and an output of the forward model is related to a current input sample and previous M−1 samples of the forward model.

2. The method according to claim 1, wherein the estimated gain of the non-linear power amplifier is specified by a manufacturer of the non-linear power amplifier.

3. The method according to claim 1, wherein the estimated gain of the non-linear power amplifier is obtained by measuring the non-linear power amplifier when a low power signal is input into the non-linear power amplifier.

4. The method according to claim 1, further comprising:
performing a simulation algorithm by using the calculated input signal of the non-linear power amplifier and a corresponding time aligned output signal of the non-linear power amplifier, to simulate an inverse model of the non-linear power amplifier,
whereby the power amplifier is linearized by using the simulated inverse model of the non-linear power amplifier.

5. An apparatus for linearizing a non-linear power amplifier, comprising:
a device for performing an iteration algorithm by using a desired output signal of the non-linear power amplifier, to calculate an input signal of the non-linear power amplifier, wherein during iteration n+1, the input signal is adjusted to cancel out the difference between actual output signal and the desired output signal that measured during iteration n, n is an positive integer;
whereby with the calculated input signal of the non-linear power amplifier, the non-linear power amplifier is linearized;
wherein the iteration algorithm is given by:

$$pa\_in_{n+1} = pa\_in_n - alpha \times \left( \frac{pa\_out_n - pa\_out\_desired}{G_n} \right),$$

wherein pa_out_desired is the desired output signal of the non-linear power amplifier, pa_in$_a$ is the calculated input signal of the non-linear power amplifier for iteration n, pa_out$_n$ is a time aligned output signal of the non-linear power amplifier for iteration n, G$_n$ is a gain of the non-linear power amplifier for iteration n which can be calculated by pa_in$_n$ and pa_out$_n$, and alpha is in a range from 0 to 1, and wherein pa_in$_1$ is the desired output signal of the non-linear power amplifier divided by an estimated gain of the non-linear power amplifier;
or
the iteration algorithm is given by:

$$pa\_mdl\_in\_corr_{n,i} = pa\_mdl\_in_{n,i} - alpha \times \left( \frac{pa\_mdl\_out_{n,i} - S_n}{G_{n,i}} \right),$$

wherein S$_n$ represents segment n and is composed of samples n*B−M to n+1*B−1 of the desired output signal of the non-linear power amplifier, pa_mdl_in$_{n,i}$ is an input signal of a forward model of the non-linear power amplifier for segment n and iteration i, pa_mdl_out$_{n,i}$ is an output signal of the forward model of the non-linear power amplifier for segment n and iteration i, G$_{n,i}$ is an gain of the forward model of the non-linear power amplifier for segment n and iteration i which can be calculated by pa_mdl_in$_{n,i}$ and pa_mdl_out$_{n,i}$, alpha is in a range from 0 to 1, and pa_mdl_in_corr$_{n,i}$ is an input correction signal for segment n and iteration i,
wherein pa_mdl_in$_{n,1}$ is S$_n$ divided by an estimated gain of the forward model, pa_mdl_in$_{n,i+1}$ is obtained by concatenating samples B to B+M−1 of pa_mdl_in$_{n−1,end}$ and samples M to B+M−1 of pa_mdl_in_corr$_{n,i}$, pa_mdl_in$_{n-1,end}$ is an input signal of a forward model of the non-linear power amplifier for segment n−1 of a final iteration, and pa_mdl_in$_{0,end}$ is 0, whereby the input signal of the non-linear power amplifier is obtained by concatenating samples M to B+M−1 of the input signals of the forward model of the non-linear power amplifier of the last iteration for all segments, wherein the forward model of the non-linear power amplifier is a zero delay and memory limited forward model, and an output of the forward model is related to a current input sample and previous M−1 samples of the forward model.

6. The apparatus according to claim 5, wherein the estimated gain of the non-linear power amplifier is specified by a manufacturer of the non-linear power amplifier.

7. The apparatus according to claim 5, wherein the estimated gain of the non-linear power amplifier is obtained by measuring the non-linear power amplifier when a low power signal is input into the non-linear power amplifier.

8. The apparatus according to claim 5, further comprising:

an electronic signal generator for repeatedly generating a signal which is the calculated input signal of the non-linear power amplifier;

a signal capturing device for capturing an output signal of the non-linear power amplifier, such that at least one period of the signal being generated by the electronic signal generator is captured; and a filter for filtering out frequencies that can not be generated by the electronic signal generator and can not be captured by the signal capturing device from a signal of subtracting pa_out_desired from pa_out$_n$.

9. The apparatus according to claim 8, bandwidths of the electronic signal generator and the signal capturing device are related to the non-linear power amplifier.

10. The apparatus according to claim 8, the signal capturing device is configured to capture the output signal of the non-linear power amplifier for iteration n more than one times, whereby an averaged result of more than one captures is taken as pa_out$_n$.

11. The apparatus according to claim 8, further comprising:

an inverse model of the signal capturing device for post-processing the output signal of the non-linear power amplifier captured by the signal capturing device, whereby a linearity of the signal capturing device can be improved.

12. The apparatus according to claim 5, further comprising:

a simulator for performing a simulation algorithm by using the calculated input signal of the non-linear power amplifier and a corresponding time aligned output signal of the non-linear power amplifier, to simulate an inverse model of the non-linear power amplifier, whereby the power amplifier is linearized by using the simulated inverse model of the non-linear power amplifier.

13. An apparatus for linearizing a non-linear power amplifier, comprising:

a device for performing an iteration algorithm by using a desired output signal of the non-linear power amplifier, to calculate an input signal of the non-linear power amplifier, wherein during iteration n+1, the input signal is adjusted to cancel out the difference between actual output signal and the desired output signal that measured during iteration n, n is an positive integer;

whereby with the calculated input signal of the non-linear power amplifier, the non-linear power amplifier is linearized; and a simulator for performing a simulation algorithm by using the calculated input signal of the non-linear power amplifier and a corresponding time aligned output signal of the non-linear power amplifier, to simulate an inverse model of the non-linear power amplifier, whereby the power amplifier is linearized by using the simulated inverse model of the non-linear power amplifier.

* * * * *

UNITED STATES PATENT AND TRADEMARK OFFICE
CERTIFICATE OF CORRECTION

PATENT NO. : 8,482,349 B2  
APPLICATION NO. : 13/255717  
DATED : July 9, 2013  
INVENTOR(S) : James Peroulas et al.

Page 1 of 1

It is certified that error appears in the above-identified patent and that said Letters Patent is hereby corrected as shown below:

In the Claims

Column 11, Line 22, Claim 1:

After "non-linear power amplifier" and before "pa_in$_a$"
insert -- , --.

Column 11, Line 25, Claim 1:

After "for iteration n, $G_n$ is a" delete "ain" and
insert -- gain --.

Column 11, Line 27, Claim 1:

After "calculated by pa_in$_n$ and pa_out$_m$"
insert -- and alpha --.

Column 11, Line 41 Claim 1:

After "composed of samples n*B-M to" delete "n+1" and
insert -- (n+1) --.

Column 12, Line 54, Claim 5:

After "composed of samples n*B-M to" delete "n+1" and
insert -- (n+1) --.

Signed and Sealed this
Eighteenth Day of March, 2014

Michelle K. Lee
*Deputy Director of the United States Patent and Trademark Office*